United States Patent
Conoci et al.

(10) Patent No.: US 7,902,070 B2
(45) Date of Patent: Mar. 8, 2011

(54) METHOD AND SYSTEM FOR PRODUCING OPTICALLY TRANSPARENT NOBLE METAL FILMS

(75) Inventors: Sabrina Conoci, Tremestieri Etneo (IT); Salvatore Petralia, Modica (IT)

(73) Assignee: STMicroelectronics S.R.L., Agrate Brianza (MI) (IT)

(*) Notice: Subject to any disclaimer, the term of this patent is extended or adjusted under 35 U.S.C. 154(b) by 797 days.

(21) Appl. No.: 11/415,843

(22) Filed: May 1, 2006

(65) Prior Publication Data
US 2007/0042195 A1 Feb. 22, 2007

(30) Foreign Application Priority Data

Apr. 29, 2005 (EP) ..................... 05009460

(51) Int. Cl.
*H01L 21/44* (2006.01)
*H01L 21/302* (2006.01)

(52) U.S. Cl. ................ 438/660; 438/686; 257/E21.497; 257/E21.333

(58) Field of Classification Search .................. 438/497, 438/507, 509, 584, 650, 686, 800, FOR. 227, 438/FOR. 274, FOR. 361, 660–663; 257/E23.162, 257/E21.006, 21.12, E21.333, E21.497, E21.592 E; 29/527.2; 427/125, 126.5, 224, 225; 428/544, 428/670; 204/192.26–192.29

See application file for complete search history.

(56) References Cited

U.S. PATENT DOCUMENTS

| | | | |
|---|---|---|---|
| 3,431,472 A * | 3/1969 | Castrucci et. al. | 257/750 |
| 4,273,624 A | 6/1981 | Laitinen et al. | |
| 4,400,255 A | 8/1983 | Kisner | |
| 4,507,851 A * | 4/1985 | Joyner et al. | 438/643 |
| 4,586,069 A * | 4/1986 | Koniger et al. | 257/455 |
| 5,178,957 A * | 1/1993 | Kolpe et al. | 428/458 |
| 5,622,826 A * | 4/1997 | Varma | 435/6 |
| 5,726,075 A * | 3/1998 | Farnworth et al. | 438/18 |
| 5,966,393 A * | 10/1999 | Hide et al. | 372/23 |
| 5,969,419 A * | 10/1999 | Tijburg et al. | 257/753 |
| 6,773,429 B2 * | 8/2004 | Sheppard et al. | 604/891.1 |
| 2008/0142371 A1 * | 6/2008 | Gualtieri | 205/184 |

OTHER PUBLICATIONS

Sortino et al., Novel Self-Assembled Monolayers of Dipolar Ruthnium(III/II)Pentaammine(4,4'-bipyridinium) Complexes on Ultrathin Platinum Films as Redox Molecular Switches, Journal of the American Chemical Society, vol. 125, No. 5, pp. 1122-1123, 2003.

Sortino et al., Monitoring photoswitching of azobenzene-based self-assembled monolayers on ultrathin platinum films by UV/vis spectroscopy in the transmission mode, Journal of Materials Chemistry, vol. 14, pp. 811-813, 2004.

Wanunu et al., Widely-Applicable Gold Substrate for the Study of Ultrathin Overlayers, Journal of the American Chemical Society, vol. 126, No. 17, pp. 5569-5576, 2004.

(Continued)

*Primary Examiner* — Matthew S Smith
*Assistant Examiner* — Quovaunda Jefferson
(74) *Attorney, Agent, or Firm* — Lisa K. Jorgenson; Paul F. Rusyn; Graybeal Jackson LLP (57) ABSTRACT

A method and system for producing a noble metal film includes the step of sputtering a noble metal on a substrate thus obtaining a film. The method and system further includes the step of subjecting the film to a thermal treatment, thus obtaining the noble metal film.

16 Claims, 7 Drawing Sheets

OTHER PUBLICATIONS

Hecq M et al: "X-Ray diffraction studies of sputtered thin films of platinum" Journal of Applied Physics, American Institute of Physics. New York, US. vol. 53, No. 1, Jan. 1982, pp. 421-427, XP001031078 ISSN:: 0021-8979.

Kojima et al: "Structure and electrical property of platinum film biased DC-sputter-desposited on silicon" Applied Surface Science, vol. 169-170, Jan. 15, 2001, pp. 320-324, XP[002346981 NL.

Mei X et al; "Micro-Structure and Electrical Properties of Nanocrystalline PT Thin Film Prepared by R.F. Sputtering" Materials Research Society Symposium Proceedings, Materials Research Society, Pittsburg, PA, US, vol. 286, 1993, pp. 179-194, XP008052735 ISSN: 0272-9172.

Gentner T H et al: "Growth, morphology and annealing of thin Co layers on Au/mica" Thin Solid Films, Elsevier-Sequoia .S.A. Lausanne, CH, vol. 275, No. 1, Apr. 1, 1996, pp. 58-60, XP004006922 ISSN: 0040-6090.

Klauk H et al.: "Ion-beam-deposited ultrathin transparent metal contacts" Think Solid Films, Elsevier-Sequoia S.A., Lausanne, CH, vol. 366, No. 1-2, May 2000, pp. 272-278, XP004203869 ISSN: 0040-6090.

Thomas John H: "Effect of pressure on dc planar magnetron sputtering of platinum" Journal of Vacuum Science and Techology A. Vacuum, Surfaces and Films, American Institute of Physics, New York, NY, US, vol. 21, No. 3, May 2003, pp. 572-576, XP012006336 ISSN: 0734-2101.

European Search Report; EP 05 00 9460 Sep. 29, 2005.

* cited by examiner

METHOD AND SYSTEM FOR PRODUCING OPTICALLY TRANSPARENT NOBLE METAL FILMS

PRIORITY CLAIM

This application claims priority from European patent application No. 05009460.6, filed Apr. 29, 2005, which is incorporated herein by reference.

FIELD OF APPLICATION

Embodiments of the present invention relate, in their more general aspects, to components for electronics applications having properties of optical transparency and electrical conductivity.

In particular, embodiments of the present invention relate to a method for producing optically transparent noble metal films, and especially a system and method of the type comprising a step of sputtering a noble metal on a substrate.

More in particular, but not exclusively, the noble metal is platinum.

According to another embodiment, the present invention also relates to a composite structure comprising a substrate and a noble metal film formed on the substrate.

PRIOR ART

The achievement of optically transparent, electrically conductive films of noble metals on transparent substrates represents an interesting technological task. Such films would have the advantage to be used as transparent materials having the characteristics of noble metals.

This is of interest both for traditional and emerging technologies, such as molecular electronics and opto-electronics.

In particular, beyond traditional applications as metal electrodes or conducting substrates, optically transparent noble metal films allow the development of the emerging molecular nanotechnology, through the self-assembly of molecule-based materials.

In other words, noble metal films are suitable for use as substrate for self-assembled molecular layers.

In fact, optically transparent noble metal films show the considerable advantage that their optical properties or those of an assembled molecular layer can be simply monitored by UVN is transmission spectroscopy.

In this last regard, ultra-thin gold films have recently been reported as semitransparent metal substrates (M. Wanunu, et al., J. Am. Chem. Soc. 2004, 126, 5569-5576). Their use and applicability as conductive and transparent materials are, however, rather limited by the presence of absorption related to the plasmon resonance of gold nanoparticle layers.

From U.S. Pat. No. 4,273,624, issued in 1981 to H. A. Laitinen; D. C. Thornton, a method for making the deposition of transparent platinum films is also known.

Embodiments of the present invention relate to the electrodeposition of a thin platinum film on a conductive thin oxide substrate. However, no specific data or statements are reported about the actual transparency of these films, being embodiments of the invention are directed to their electrochemical applications.

A simple method is also known, from some preliminary studies provided by the Applicant, for obtaining ultra-thin platinum films having a good optical transparency in the UV-Vis region. The application of the platinum films thus obtained are suitable as substrates of self-assembly monolayers of molecular materials (S. Sortino, et al. J. Am. Chem. Soc. 2003, 125, 1122-1123; J. Mater. Chem. 2004, 14, 811-813). In particular, this method discloses a sputtering step for carrying out the noble metal deposition.

This known method, although allowing a deposited film to be obtained, which exhibits a combination of good optical transparency and homogeneity, chemical and mechanical robustness, has however some still unsolved drawbacks.

The main drawback lies in that homogeneity, chemical and mechanical robustness and optical transparency of the deposited film are often not so high as to satisfy the requirements of some applications.

In particular, it is to be considered that the emerging applications, such as hybrid electrical and opto-electronic devices, keep on requiring further improvement of optical transparency, conductivity, homogeneity, chemical and mechanical robustness.

For this reason, there is the need of further improving the characteristics of the noble metal film in order to satisfy the requirements of any applications, also highly sophisticated applications such as electrical and opto-electronic devices, or transparent transistors.

SUMMARY OF THE INVENTION

According to one embodiment of the present invention, a method produces optically transparent noble metal films suitable for use as a base for self-assembled molecular layers and also possessing characteristics of conductivity, chemical and mechanical robustness, purity, and homogeneity comparable to those of metal electrodes or bulky conductive metals.

In particular according to an embodiment of the present invention, the method for producing a metal noble film comprises the steps of sputtering a noble metal on a substrate thus obtaining a film and subjecting the film to a thermal treatment thus obtaining the noble metal film.

The thermal treatment allows a heated noble metal film to be obtained, which exhibits good optical transparency and better conductivity, better homogeneity, better chemical and mechanical robustness with respect to the prior art films and comparable to those of metal electrodes or bulky conductive metals.

In a first embodiment of the invention, the thermal treatment is performed by means of an annealing step.

In a second embodiment of the invention, the thermal treatment is performed by means of a flaming step.

According to another embodiment of the present invention, a composite structure is obtained which comprises a substrate and a noble metal film formed on the substrate and suitable for use as a base for self-assembled molecular layers, wherein the noble metal film has an optical transmittance of at least 70% and at least a resistivity having average values comprised between about $346 \times 10^{-6}$ ☐ cm and about $10 \times 10^{-6}$ ☐ cm.

Further characteristics and advantages of the method and of the composite structure according to the embodiments of the invention will be apparent from the following description of some embodiments thereof given by way of indicative and non limiting example with reference to the annexed drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded With reference to the annexed drawings, reference number 10 globally indicates a scheme of a method according to an embodiment of the invention for the production of a noble metal film on a substrate 14.

In particular, according to FIGS. 1A to 1E and FIGS. 1F to 1J, the noble metal film thus produced is indicated either with reference number 12 or reference number 18.

The noble metal film 12, 18 thus obtained is suitable for use as a part of electronic devices, i.e. electrodes, solar cells, touch display panels, flat panel displays, transparent transistors, optical and antistatic coatings, hybrid electrical and opto-electronic devices based on molecular or bio-molecular films.

The method steps and the structures hereafter described are not a complete process flow for the manufacturing of the above devices.

In fact, embodiments of the present invention can be put into practice with the manufacturing techniques currently used in the field of any of the above devices and hereafter only those commonly used method steps are described which are necessary for the comprehension of the embodiments of the invention.

The figures showing cross sections of the noble metal film 12, 18 formed on the substrate 14 during the manufacturing are not drawn to scale, but they are instead drawn so as to show the important features of the embodiments of the invention.

A method comprises the main steps of sputtering a noble metal on a surface 15 of the substrate 14 thus obtaining a film 16 and subjecting the film 16 to a thermal treatment, thus obtaining a heated metal film 12, 18.

Preferably, the thermal treatment is carried out at a temperature of at least 300° C.

In other words, the method provides a heating treatment of the film 16, which ensures an optimization of the optical transparency, conductivity, homogeneity, chemical and mechanical robustness of the film.

After the thermal treatment a composite structure comprising the substrate 14 and the film 12, 18 is obtained.

The results obtained by the process can be explained from a physical point of view as follows.

The thermal treatment provokes an improvement in the connection between metal grains giving rise to consequent optimized properties.

In the described embodiment the noble metal is platinum and the substrate 14 is a glass slide substrate, but it could also be made of another transparent material such as quartz, which similarly to the glass substrate is not atomically flat and has a rough surface.

The optically transparent substrate 14 has the advantage of enabling the detection of the optical properties of the composite structure by UV/VIS transmission spectroscopy.

In a first embodiment, the method includes the following steps (see FIGS. 1A-1E).

In a first step, platinum is sputtered on the substrate 14, for example by means of a sputtering system 25, for example an Emitech K650X Sputtering Coater.

Figures 1A, 1B:
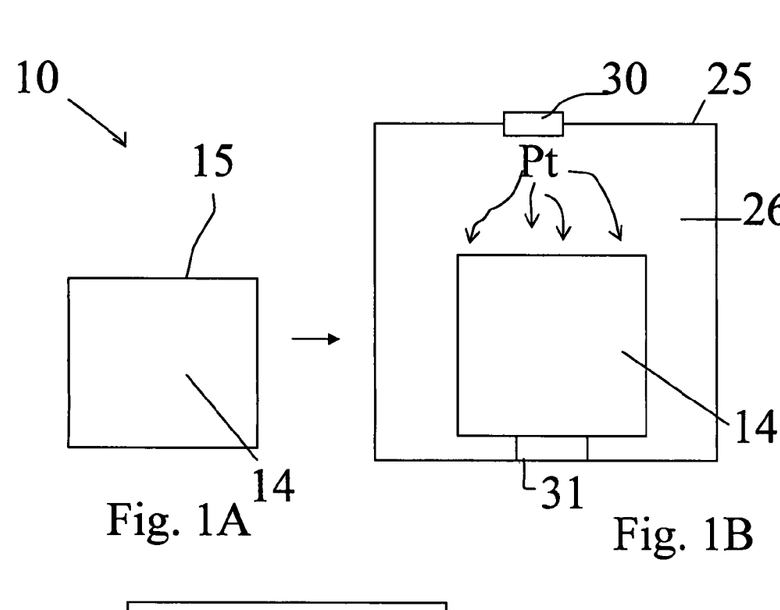
FIGS. 1A-1E are respective schematic views of an operative sequence of a method according to an embodiment of the invention.
Figure 1C:
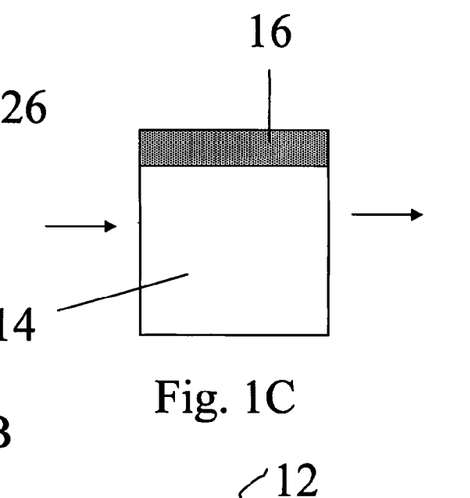
Figure 1D:
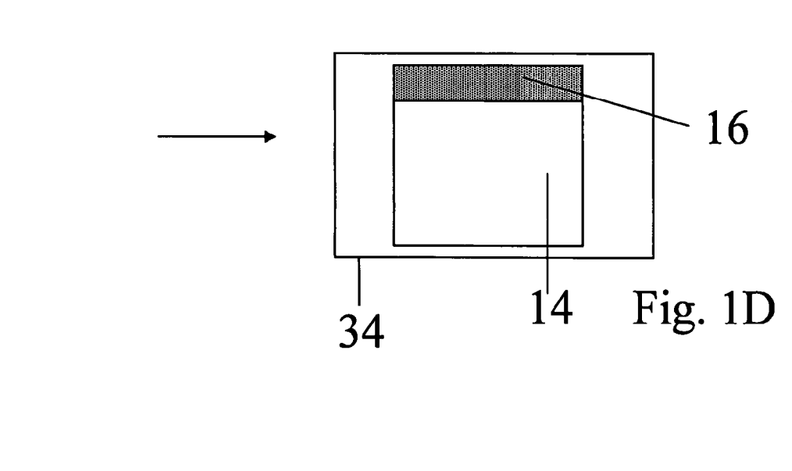
Figure 1E:
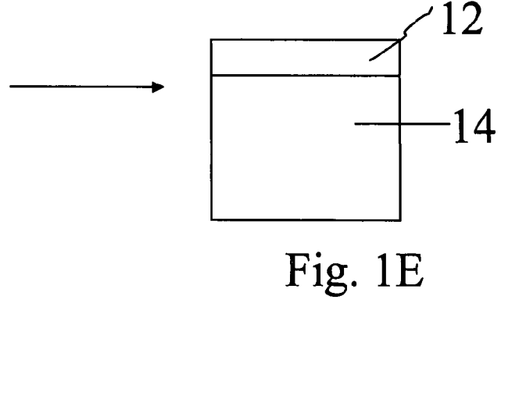
Figures 1F, 1G, 1H:
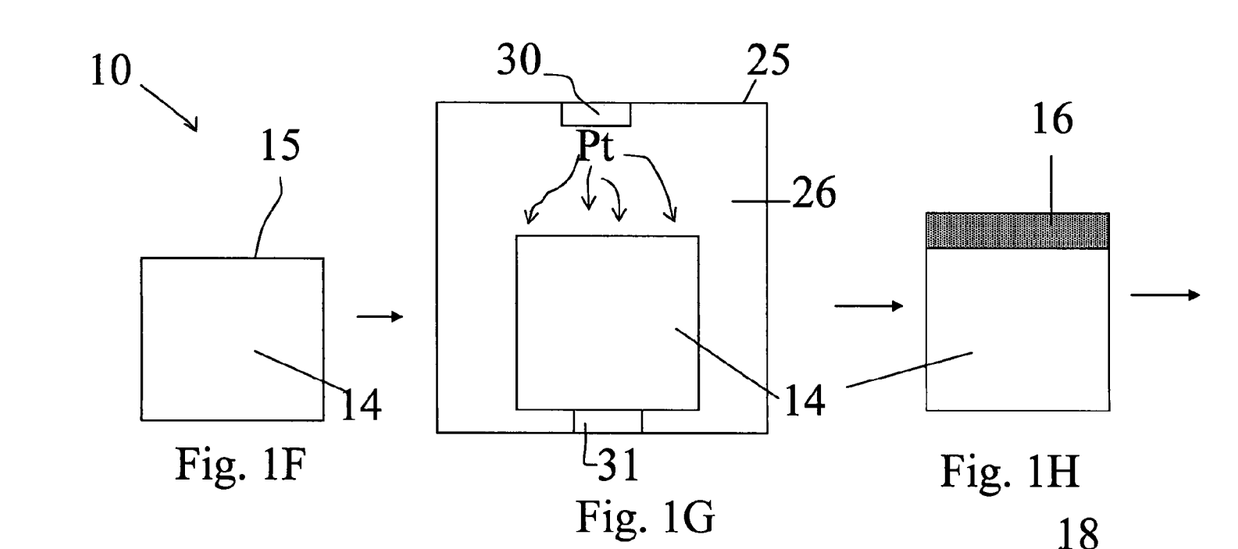
FIGS. 1F-1J are respective schematic views of an operative sequence of a method according to another embodiment of the invention.
Figure 1I:
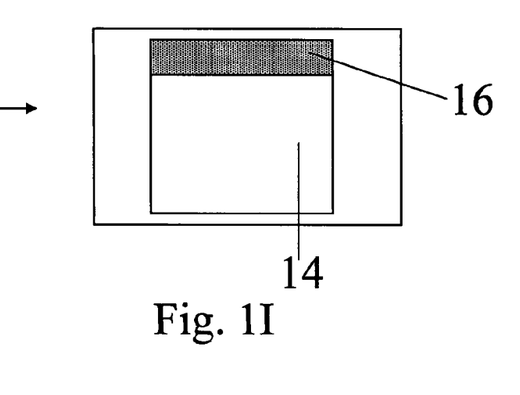
Figure 1J:
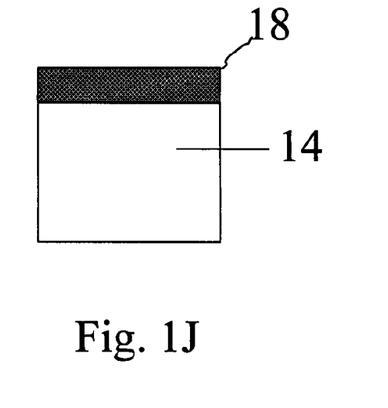

This system 25, which is schematically shown in FIG. 1B, comprises a sputter chamber 26 having, on top, a negative cathode 30 made of the target material to be sputtered, i.e. platinum.

On the bottom of this chamber 26, at a distance of about 6 cm from the cathode, an anode 31 plate is located where the substrate 14 is placed and that is usually "earthed" to the system.

The cathode and the anode are schematically illustrated in FIG. 1B with reference numbers 30 and 31 respectively.

Moreover, the system 25 operates under argon atmosphere. In other words, the chamber 26 is kept under argon atmosphere.

Preferably, the chamber 26 is set under an operating pressure, also called relative vacuum, of about $1 \times 10^{-1}$ mbar. The above desired operating pressure is obtained by means of a suitable applied vacuum, usually a two stage rotary pump (not shown).

The inert gas, such as argon in the present embodiment, is admitted to the chamber 26 by a fine control valve ($2 \times 10^{-1}$ mbar). The valve is not shown in the drawings.

It is to be noticed that the above system 25 is suitable for sputtering platinum at the same time on a plurality of substrates 14.

However, for sake of conciseness, hereafter in the description the method is disclosed with reference to a single substrate 14.

In any case, it is to be understood that the following steps can be performed also for sputtering platinum on a plurality of substrates 14.

In the illustrated case, the surface size of each substrate, on which platinum is spattered, is of about 1 cm×2 cm. As above mentioned, either glass or quartz can be used as transparent substrate 14.

Preferably, before introducing the substrate 14 into the chamber 26, the substrate 14 is first sonicated for 180 sec in a 2-H propanol bath and then dried in an oven at 80° C. for 30 min.

The substrate 14 is then introduced into the sputtering system 25.

Successively, a suitable voltage is applied on the electrodes, namely the anode 30 and the cathode 31, and a glow discharge is generated in the chamber 26. This operation determines the sputtering of platinum and therefore the deposition of platinum on the substrate 14.

Under the above conditions, the sputtering step preferably involves a sputtering time of 165 s with a current of 75 mA.

After deposition on the substrate 14, the above-cited film 16 is thus obtained.

Subsequently, the film 16 is extracted from the sputtering system 25 and kept at room temperature in an appropriate sample-tray.

In particular, under the above-described conditions, the sputtering step produces a platinum film 16 having an average thickness of 25 nm.

This measure of thickness is obtained as result of a SEM analysis (Scanning electron microscope) carried out by means of a LEO 1550 Instrument operating at 5 kV. A micrography of the Pt/substrate interface is obtained by the tilting the sample of about 18°.

Afterwards, the film 16 is monitored by UV/Vis transmission spectroscopy, in order to assess its optical transmittance.

From the analysis, it has emerged that the optical transmittance always ranges from 70% to 90% in the 300-800 nm spectral region.

Figure 2:
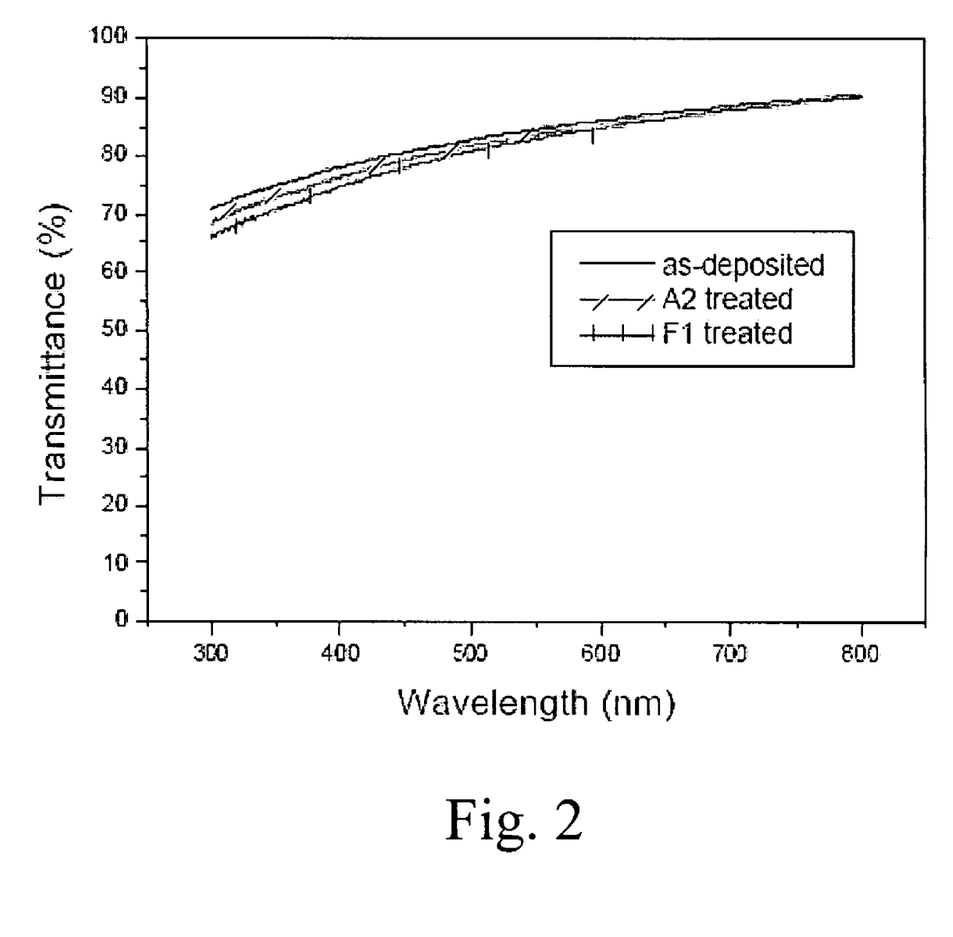
FIG. 2 shows a plot including three UV-Vis spectra of a Pt film, annealed Pt film (A2) and flamed Pt film (F1), respectively.

FIG. 2 illustrates the UV-Vis spectrum of the Pt film 16. More details of the UV-Vis spectra of FIG. 2 are reported hereafter in the description.

As it is known, optical transmittance depends on the thickness of the film 16. As a consequence, it is to be understood that the longer is the sputtering time, the thicker will be the film 16 and the lower the optical transparency.

It is also to be noticed that the above-described conditions are chosen since they are considered as a good compromise to obtain films having at the same time good electrical and morphological characteristics and a very good optical transparency.

The morphological characteristics of the film 16 have been monitored by means of an atomic force microscope (AFM). In particular the measurements have been made by means of a Digital 3100 Instrument, which adopts a tapping mode analysis.

Figure 3A:
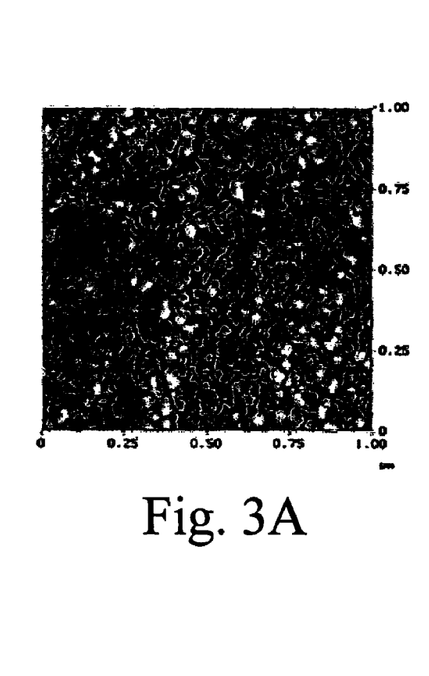
FIGS. 3A-3C show AFM (atomic force microscope) images of the Pt film, annealed Pt Film and flamed Pt film of FIG. 2 respectively.

In FIG. 3A an AFM image is illustrated, which shows that the film 16 consists of homogeneously distributed polycrystals, which have the following size: lateral size comprised between about 25 and about 30 nm and height comprised between 2 and 5 nm.

The related Root Mean Square Roughness (RMS) is 1.75 nm.

The mechanical properties of the film 16 have also been measured.

To do this, the resistivity of the film 16 has been measured by a known Four-Point Probe method.

This method has been carried out by using a linear array arrangement, probe-tips of wolframium of 2 μm radius, 1 mm spaced, connected to an Agilent 4155C Semiconductor Parameter Analyzer and to a FLUKE 85 series III RMS Multitester voltage measure.

The results have shown average values of $690 \times 10^{-6}$ Ωcm.

As above-mentioned, in order to improve the above-described homogeneity, chemical and mechanical robustness of the film 16, the latter is subjected to thermal treatment. In this embodiment the thermal treatment comprises an annealing treatment.

The annealing treatment provides the step of heating the film 16 in an annealing oven 34, preferably in presence of air.

From the annealing treatment an annealed platinum film 12 is thus obtained.

In the present embodiment, the annealing treatment involves a heating at 350° C. for 12 h, with the oven 34 being heated at a heating rate of 5° C./min. Air-cooling is then applied for cooling the oven 34.

According to an embodiment of the invention, at this point the film 12 is still highly transparent (optical transmittance>70%). FIG. 2 illustrates the UV-Vis spectrum in the 300-800 nm spectral region of the annealed platinum film 12.

In particular, in FIG. 2, annealed platinum film 12 is denoted with reference sign A2.

It is to be noted that the annealed platinum film 12 shows a higher absorption in the UV-Vis spectral region than the film 16.

It has also been observed that the annealed platinum film 12 has a better homogeneity, larger conductivity, and higher chemical and mechanical robustness, than the film 16.

The above characteristics have been measured as follows.

The morphological characteristics of the annealed platinum film 12 have been monitored, as for the film 16, by means of an AFM.

Figure 3B:
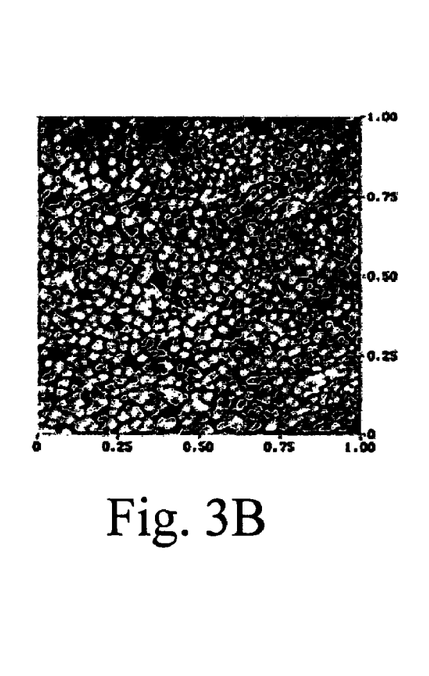

In particular, FIG. 3B illustrates an AFM image, which shows that the annealed platinum film 12 consists of polycrystals having the following sizes: lateral size comprised between 40 and 70 nm, and height comprised between 9 and 10 nm. The related Root Mean Square Roughness (RMS) is about 3.7 nm.

An increase of the values with respect the film 16 is thus obtained.

Also the electrical and mechanical properties of the annealed platinum film 12 have been measured and compared with those of the film 16.

For this purpose, the resistivity of the annealed platinum film 12 has been measured according to the above-mentioned Four-Point Probe method.

In carrying out this method the same operative conditions as for the film 16 have been used.

From the measurements, average values of $346 \times 10^{-6}$ Ωcm of the resistivity have been obtained.

A Transmission Electronic Microscopy (TEM) analysis of the annealed platinum film 12 has been also carried out to measure its thickness.

In particular, a cross-sectional view of the Pt/glass interface is obtained by using a Jeol JEM 2010 instrument operating at 200 kV; the measured thickness of the platinum film has been of 20 nm.

It can be noticed that the thickness of the annealed film 12 is lower than that of the film 16. This means that the annealed platinum film 12 is more compacted than the film 16 and appears to be without important porosity.

From the above results, it is confirmed that the thermal treatment, namely the annealing treatment, also leads to a remarkable chemical and mechanical robustness of the noble metal film.

In order to further show the improvement of the characteristics of the above film, both the annealed platinum 12 and the film 16 have been subjected to the following treatments:

sonication of the films 12 and 16 in CH3OH bath, for 40 min, at room temperature; and immersion of films 12 and 16 in a CH3OH bath, for 70 h, at 60° C.

These treatments are examples of aggressive chemical conditions used during chemical reactions.

With reference to FIGS. 4A-4C and FIGS. 5A-5C the first treatment i) and the second treatment ii) are indicated with T1 and T2 respectively.

With reference to FIGS. 4A-4C and FIGS. 5A-5C, the film 16 and the annealed platinum film 12 have been analyzed by means of optical micrography analysis with an Olympus MX50 Instrument.

Figure 4A:
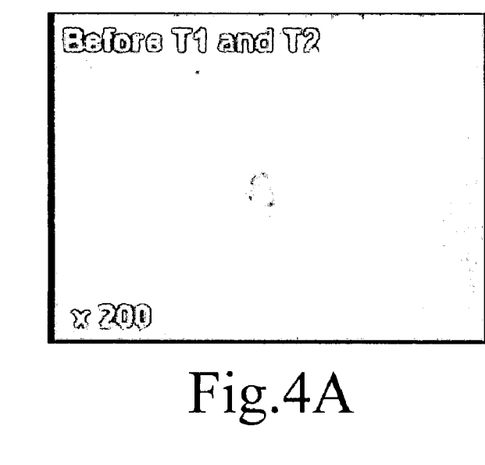
FIGS. 4A-4C show an optical micrography of a Pt film before and after determined T1 and T2 chemical treatments respectively.
Figure 4B:
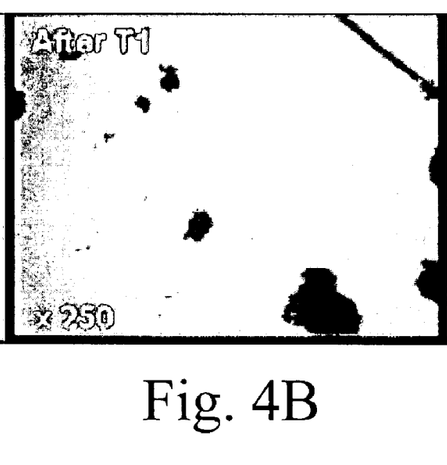
Figure 4C:
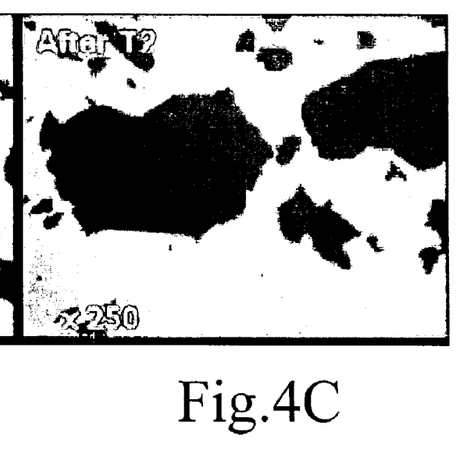

From the analysis, it results that some significant changes of the film 16 are involved before and after the above T1 and T2 treatments respectively, as shown in FIGS. 4A-4C.

Figure 5A:
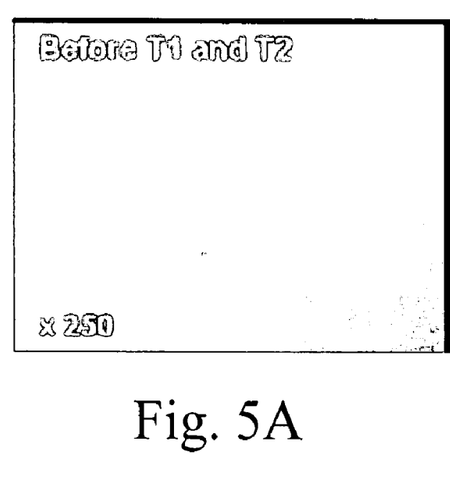
FIGS. 5A-5C show an optical micrography of an annealed Pt film before and after determined T1 and T2 chemical treatments respectively.
Figure 5B:
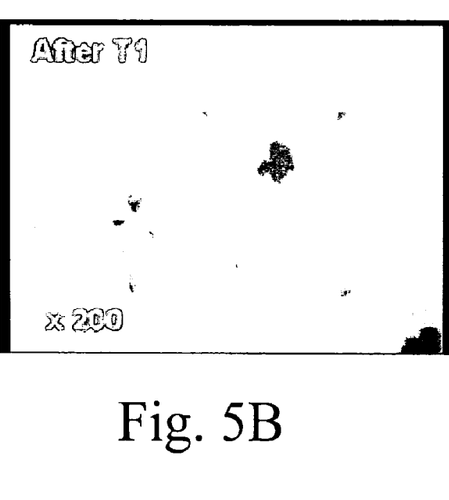
Figure 5C:
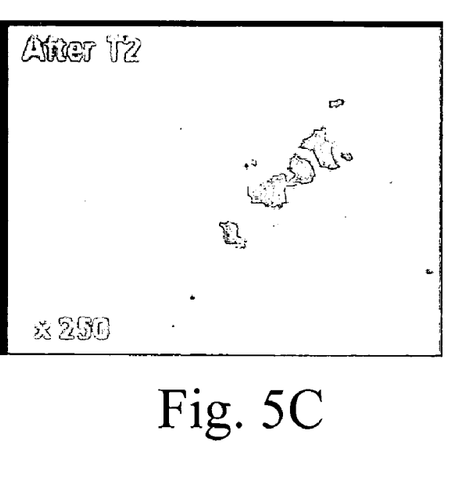

On the contrary, it results that no significant changes of the annealed platinum film 12 are involved before and after the above T1 and T2 treatments respectively, as shown in FIGS. 5A-5C.

As a consequence, it has been proved that the annealed platinum film 12 is more suitable than the film 16 for undergoing chemical treatments enabling the possibility to achieve in situ chemical reactions for the preparation of self assembled monolayers on a variegated scale for the production of any of the above-mentioned devices.

In other words, it has been proved that the annealing step improves the properties of the film and enables the metal noble film 12 to be subjected to chemical reactions.

Moreover, in order to further monitor the characteristics of the annealed film 12, an assessment of its physical adhesion on the glass-slide substrate 14 has been made.

To do this, linear scratch tests obtained by a Nano Hardness Tester with Open Platform CSM Instrument have been carried out. The operative conditions have been as follows: progressive load 0.2-1 mN; diamond Rockwell-type indenter of 5 µm radius; run length 1 mm.

First events of damage (minor cracks) appear at higher load (0.73 mN) with respect to the film 16 (0.58 mN), thus indicating a better adhesion upon annealing treatment.

In a further embodiment, a method comprises the following steps as shown in FIGS. 1F-1J.

In a first step platinum is sputtered on the substrate 14 thus obtaining the film 16. The sputtering step has been performed according to the operative conditions, which have been described for the first embodiment of the method.

In the present embodiment, the method comprises a step of flaming the film 16 to further improve the overall characteristics of the film.

In other words, in this further embodiment, the thermal treatment comprises a step of flaming the film 16.

In particular the film 16 has been subjected to a flaming treatment for a determined period. For sake of clarity, the film obtained from the flaming treatment is hereafter defined as flamed film 18.

The flaming treatment is carried out after the sputtering step and it is carried out for 30 sec by using a butane-flame apparatus.

In particular, the known flaming apparatus FLAME CONTROL "Poligos" (Vallini G., Senago (MI), CAT. Number: 785) has been used.

It has been estimated that, in the case of butane-flame, the flaming temperature of the film is comprised between 1000-1200° C.

Hereafter, the results of the optical, chemical, mechanical and electrical tests, which have been performed on the flamed film 18, are reported.

In particular, the flamed film 18 is still transparent (optical transmittance>70%). FIG. 2 illustrates the UV-Vis spectrum in the 300-800 nm spectral region of the flamed film.

In particular, in FIG. 2, flamed film 18 is denoted with reference sign F1.

It is to be noted that the flamed film 18 has a higher absorption in the UV-Vis spectral region than the film 16.

The flamed film 18 has also larger conductivity, and higher chemical and mechanical robustness, than the film 16.

Figure 3C:
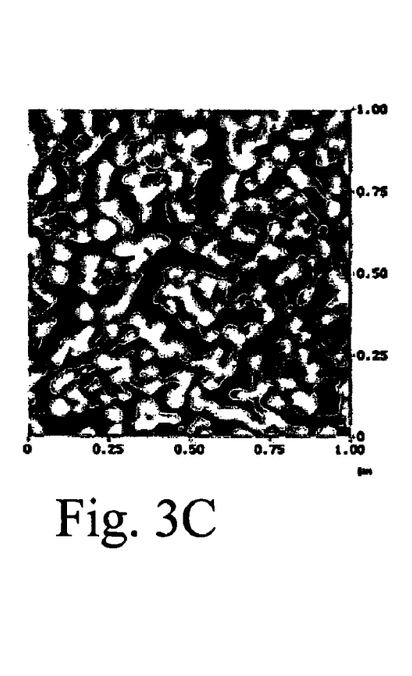

In particular, the flamed film 18 has been subjected to the above-mentioned AFM analysis. The flamed film 18 shows an increase of the size of polycrystals, namely lateral size of 40÷100 nm, and height of 11÷20 nm. The related Root Mean Square Roughness (RMS) is of 5.3 nm.

The AFM also indicates the formation of a network of "worm-like" platinum film on the substrate 14.

The above-mentioned TEM analysis of the flamed film for measuring its thickness has been also carried out. In particular, the cross-sectional view of the Pt/substrate 14 interface is obtained by using a Jeol JEM 2010F instrument operating at 200 kV.

The TEM analysis indicates a thickness of 18 nm. Also the mechanical properties of the flamed film 18 have been measured and compared with the film 16.

To do it, the resistivity of the flamed film 18 has been measured according the above-mentioned Four-Point Probe method.

The resistivity of the flamed film shows average values of $39 \times 10^{-6}$ Ωcm, being very close and comparable to that measured for bulk platinum ($10 \times 10^{-6}$ Ωcm).

The flaming treatment also leads to a remarkable chemical and mechanical robustness.

For further showing the properties of the flamed film, this latter has been subjected to the above-cited treatments T1 and T2, namely: sonication of the flamed film in CH3OH bath, for 40 min, at room temperature (T1); and immersion in a CH3OH bath, for 70 h, at 60° C. (T2).

Figure 6A:
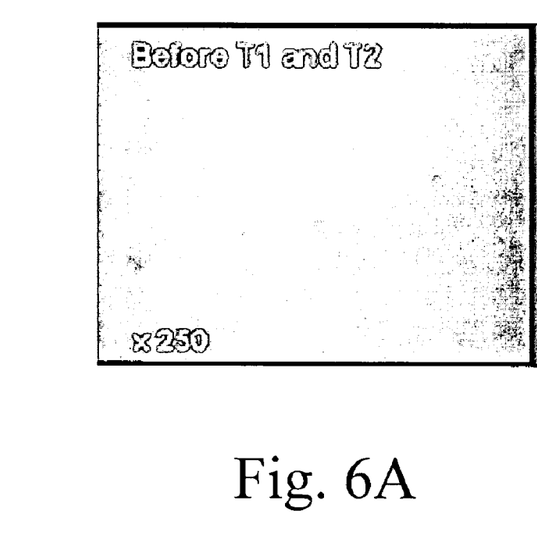
FIGS. 6A-6C show an optical micrography of a flamed Pt film before and after determined T1 and T2 chemical treatments respectively.
Figure 6B:
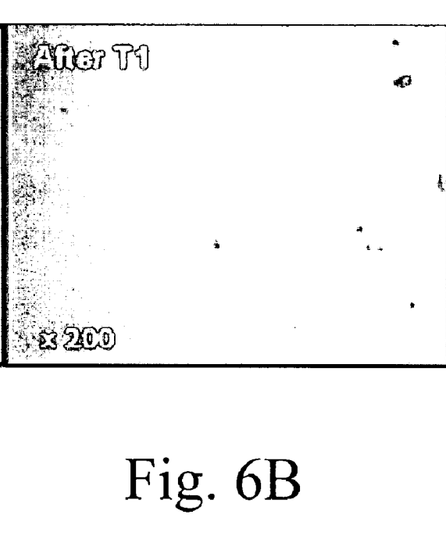
Figure 6C:
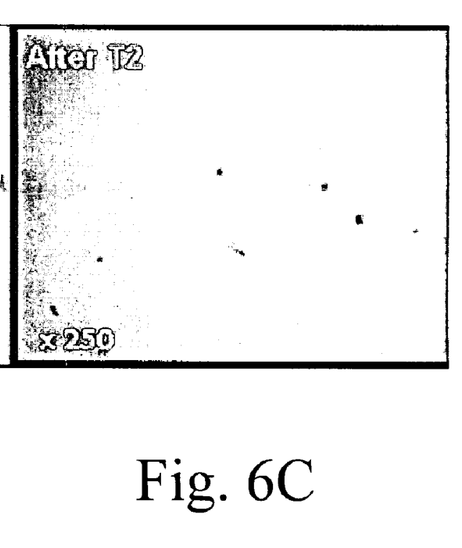

With reference to FIGS. 6A-6C, it has been proved that no changes are involved before and after the above T1 and T2 treatments, as shown by optical micrography analysis carried out by an Olympus MX50 Instrument.

As a consequence, it has been proved that the flamed film 18 is more suitable than the film 16, even than the annealed film 12, for undergoing chemical treatments enabling the possibility to achieve in situ chemical reactions for the preparation of self assembled monolayers on a variegated scale for the production of any of the above-mentioned devices.

In other words, it has been proved that the flaming step improves the properties of the film and enables the flamed film 18 to be subjected to chemical reactions.

Moreover, in a further analysis, the physical adhesion of the flamed film 18 on the glass-slide substrate 14 has been also assessed. Also in this case, the same operative conditions as for the annealed film 12 have been used to carry out the analysis.

First events of damage (minor cracks) appear at the applied load of 0.98 mN, corresponding almost to the final value (1 mN).

It is to be noticed that the applied load (0.98 m) is higher than that of the annealed film 12, thus indicating a better adhesion upon flaming treatment.

All the results discussed above are summarized as follows:

TABLE 1

|  | Film As-prepared (sputtered) | Method 1: Film Annealed at 350° C. 12 h | Method 2: Film Flamed |
| --- | --- | --- | --- |
| Thickness | 25 nm | 20 nm | 18 nm |
| Transmittance 300–800 nm | 70–90% | >70% | >70% |
| Resistivity | 690 $10^{-6}$ Ω cm | 346 $10^{-6}$ Ω cm | 39 $10^{-6}$ Ω cm (very close to Pt bulk 10 $10^{-6}$ Ω cm) |
| Adhesion (Load for minor cracks) | 0.58 mN | 0.73 mN | 0.98 mN |
| Mechanical Resistance to chemical treatment T1 | Very Poor | Good | Very Good |
| Mechanical Resistance to chemical treatment T2 | Very Poor | Good | Very Good |

In the last specific embodiment, a composite structure is obtained wherein the noble metal film consists of polycrystals having the following properties:

lateral size of polycrystals comprised between 70 and 100 nm;

height of polycrystals comprised between about 11 and 20 nm;

Root Mean Square Roughness of polycrystals of about 5.3 nm;

resistivity having an average value of $39 \times 10^{-6}$ $\Omega$cm.

load resistance of 0.98 mN.

It is to be noticed that resistivity value of $39 \times 10-6$ $\Omega$cm is very close to that measured for bulk platinum ($10 \times 10-6$ $\mu\Omega$cm).

It is also to be remarked that the load resistance is referred to the maximum load that can be applied to the film during the scratch test (mechanical test) before that the first surface damage event (minor cracks) occurs.

The metal noble film of the above composite structure is suitable for covalently anchoring organic molecules or biomolecules in order to prepare molecular self assembled layers of organic molecules or molecular self assembled layers of bio-molecules. The molecules comprise:

thiol-terminated chemical groups—SH; or thioethers chemical groups—SR, where R are alkyl groups.

Moreover, the metal noble film of the above composite structure is suitable for selectively adsorbing chemical species such as carbon monoxide.

The main advantage stays in that, thanks to the combination of the sputtering step and the thermal treatment, an ultra-thin noble metal film suitable for use as substrate for self-assembled molecular layers (and preferably having a thickness comprised between 10 and 30 nm) is produced, which offers a unique combination of properties making them well-suited to be employed in a variegated range of applications.

In particular, thanks to the combination of the sputtering step and the thermal treatment, the noble metal film has mechanical and electrical properties similar to those of bulk noble metals.

Another advantage is that of obtaining a metal noble film without important porosity.

Moreover, the use of platinum as noble metal offers the advantage that ultra-thin Pt films exhibit the plasmon absorption (ca 260 nm) in the extreme UV region, thus exhibiting optical transparency in almost the whole UV-VIS region.

In this context, apart from the conventional applications (such as transparent metal electrodes, solar cells, touch display panels, flat panel displays, transparent transistors, optical and antistatic coatings, etc.) platinum film is particularly indicated in applications for hybrid electrical and optoelectronic devices based on molecular or biomolecular films.

Indeed, in this concern, the main advantages offered by Pt based composite structures are the molecular self-assembly of thiol-derivatives by covalent binding.

Moreover the resistivity of platinum film is very close to that measured for bulk platinum.

Moreover, Pt is preferred to more employed Au because it is compatible with silicon (Si CMOS technology), allowing integration with conventional Si CMOS technology for the production of hybrid molecular devices.

In addition, the mechanical robustness and the resistance towards chemical agents of such metal noble films and preferably Pt films allow the preparation of mono- and multiplayer molecular films, by molecular self-assembling, that can be further chemically modified by appropriate in situ chemical reactions.

This offers high flexibility in the preparation of molecular systems chemisorbed on these Pt films.

Moreover, the optical transparency and low electrical resistance of such Pt-based composite structure allow the simultaneous monitoring of optical and electrical properties of molecular films thus enabling their employment in optoelectronics applications.

Another advantage lies in that the method requires a reduced number of the steps necessary for the realization of the noble metal film, and a simplification of the traditionally used tools.

Thermal treatments in fact comprise already consolidated techniques, i.e. annealing or flaming treatments, which ensure a high reproducibility.

It follows that the method according to embodiments of the invention is cheap and at the same time ensures reproducible films to be obtained.

Obviously, a technician of the field, in order to satisfy contingent, specific needs, will understand modifications and variations to the above described method and composite structure, all within the scope of protection of the embodiments of the invention as defined by the following claims.

From the foregoing it will be appreciated that, although specific embodiments of the invention have been described herein for purposes of illustration, various modifications may be made without deviating from the spirit and scope of the invention.

What is claimed is:

1. A method of forming a noble metal film on a substrate, the method comprising:

sputtering platinum to form a platinum film on the substrate; and flaming the platinum film to obtain a flamed platinum film having an optical transmittance of at least 70% in the 300-800 nm spectral region.

2. The method according to claim 1, further comprising, after the operation of flaming the platinum film, sonicating the flamed platinum film in a $CH_3OH$ bath.

3. The method according to claim 2, wherein the operation of sonicating comprises sonicating the flamed platinum film for at least approximately 30 minutes, and preferably for approximately 40 minutes.

4. The method according to claim 1, wherein after the operation of flaming the method comprises immersing the flamed platinum film in a $CH_3OH$ bath at a temperature of at least approximately 50° C., and preferably approximately 60° C.

5. The method according to claim 4, wherein the flamed platinum film is immersed in the $CH_3OH$ bath for at least approximately 50 hours, and preferably approximately 70 hours.

6. The method according to claim 1, wherein flaming involves a heating at a temperature of at least 1000° C.

7. The method according to claim 1, wherein flaming involves a heating at a temperature comprised between 1000° C. and 1300° C., preferably comprised between 1000° C. and 1200° C.

8. The method according to claim 1, wherein the flaming is performed by means of a butane flame.

9. The method according to claim 1, wherein flaming is carried out for about 20 to 40 seconds, in particular for about 30 seconds.

10. The method according to claim 1, wherein the sputtering is performed under an inert gas atmosphere.

11. The method according to claim 1, wherein during sputtering the platinum film is located in a sputter chamber having a negative cathode which is made of platinum and an anode plate on which the substrate is placed.

12. The method according to claim 11, wherein the chamber is under a set relative vacuum of about $1 \times 10^{-1}$ mbar.

13. The method according to claim 1, wherein the flamed platinum film is ultra-thin, having a thickness comprised between 10 nm and 30 nm.

14. The method according to claim 1, wherein the substrate is made of an optically transparent material having a rough surface such as glass.

15. A method for producing a noble metal film comprising the step of sputtering platinum on a substrate thus obtaining a film of platinum, wherein the film of platinum is thermally treated in such a way to obtain a film of platinum suitable for a self-assembled, thiol-terminated, molecule-based materials and for in situ chemical synthesis, the film of platinum further having an average resistivity of approximately $39 \times 10^{-6}$ Ω cm, an optical transmittance in the UV region higher than 70%, and a load resistance of approximately 0.98 mN, and wherein the film is treated by means of a flaming operation to heat the film of platinum at a temperature between approximately 1000° C. and 1200° C. for approximately 30 seconds.

16. The method of claim 15, wherein the substrate is made of glass.

* * * * *